United States Patent [19]
Longueville et al.

[11] Patent Number: 5,906,501
[45] Date of Patent: May 25, 1999

[54] CONNECTOR ASSEMBLY WITH AN ACTUATION AID FOR CONNECTING AND RELEASING AN ELECTRICAL CONNECTOR

[75] Inventors: Jacques Longueville, Oostkamp, Belgium; Peter Pagnin, Munich, Germany

[73] Assignee: Siemens Aktiengesellschaft, Munich, Germany

[21] Appl. No.: 08/625,632

[22] Filed: Mar. 29, 1996

[30] Foreign Application Priority Data

Mar. 29, 1995 [DE] Germany .............................. 195 11 509

[51] Int. Cl.⁶ ...................................................... H01R 13/62
[52] U.S. Cl. ............................................. 439/327; 439/372
[58] Field of Search ...................................... 439/260, 267, 439/327, 372, 377, 153, 157, 159

[56] References Cited

U.S. PATENT DOCUMENTS

| | | |
|---|---|---|
| 3,130,351 | 4/1964 | Giel . |
| 3,475,717 | 10/1969 | Lane . |
| 4,846,730 | 7/1989 | Owen . |
| 5,398,164 | 3/1995 | Goodman et al. ................... 439/377 X |
| 5,506,758 | 4/1996 | Cromwell ............................ 439/327 X |
| 5,601,349 | 2/1997 | Holt .................................... 439/327 X |

FOREIGN PATENT DOCUMENTS 42 41 256  6/1994  Germany .
94/14212  6/1994  WIPO .

OTHER PUBLICATIONS

Publ. "Components 30/1992, No. 5" (Heilmann), pp. 189–192, "Steckverbinder" (Connectors).
Publ. "Markt & Technik–Wochenzeitung fuer Elektronik No. 26, Jun. 1994", pp. 36–37, "Bauelemente" (Components).

Primary Examiner—Khiem Nguyen
Attorney, Agent, or Firm—Herbert L. Lerner; Laurence A. Greenberg

[57] ABSTRACT

An assembly for connecting a first printed circuit board with a second printed circuit board includes an electrical connector connected to one of a first and second printed circuit board. The electrical connector has a retaining mechanism for maintaining the electrical connector in a connected position. The assembly also includes an actuation aid having a first end oriented toward the electrical connector for actuating the retaining mechanism. The actuation aid also has a second end remote from the electrical connector accessible in a region outside the first and second printed circuit board. The first end actuates the retaining mechanism of the electrical connector when the second end is actuated.

21 Claims, 4 Drawing Sheets

CONNECTOR ASSEMBLY WITH AN ACTUATION AID FOR CONNECTING AND RELEASING AN ELECTRICAL CONNECTOR

BACKGROUND OF THE INVENTION

FIELD OF THE INVENTION

The present invention relates to an assembly with an actuation aid for connecting and releasing an electrical connector, in which the electrical connector electrically connects a first printed circuit board to a second printed circuit board.

Electrical connectors for connecting printed circuit boards are known in great variety.

As a representative example, reference is made to the 2.5 mm family of plug connectors known as SIPAC, made and sold by Siemens Aktiengesellschaft. Descriptions of the basic model and of further developments in that electrical connector have been published in "Components", 30 (1992), No. 5, pp. 189–192 and in "Markt und Technik-Wochenzeitung für Elektronik" (Market and Technology-Electronics Weekly) No. 26, Jun. 24, 1994, pp. 36–37.

Since efforts to make electrical connectors HF-compatible generally lead to the provision of a great number of additional ground contacts, and since with technological progress the number of signals to be transmitted and, thus, both the number of transmission lines and the speed of transmission are certainly on an upward rather than a downward trend, it is becoming more and more difficult and expensive to manipulate conventional electrical connectors.

The higher the polarity of the conventional electrical connectors, the more force that must be exerted to connect them to and disconnect them from contact strips such as male or female multipoint connectors used for contacting purposes.

A further factor is that the requisite exertion of force unavoidably leads to deformation of the printed circuit boards to be connected or disconnected, and, thus, threatens damage to the components mounted on the printed circuit boards, especially surface mounted devices.

Known assemblies for connecting and disconnecting an electrical plug connection cannot as a rule be used, especially with printed circuit board connectors, because the actuation aids are normally very poorly accessible.

Moreover, while the known actuation aids can help reduce the expenditure of force on the part of the user, nevertheless the forces acting on the printed circuit boards, with the attendant risks and disadvantages, remain unchanged.

SUMMARY OF THE INVENTION

It is accordingly an object of the invention to provide an assembly with an actuation aid for connecting and releasing an electrical connector, which overcomes the hereinaforementioned disadvantages of the heretofore-known methods and devices of this general type and which simply and reliably reduces the strain on the printed circuit boards when connected and disconnected to a minimum.

With the foregoing and other objects in view there is provided, in accordance with the invention, an assembly for connecting a first printed circuit board with a second printed circuit board, comprising: an electrical connector connected to one of a first and second printed circuit board, recesses electrical connector having a retaining mechanism for maintaining recesses electrical connector in a connected position; an actuation aid having a first end oriented toward recesses electrical connector for actuating recesses retaining mechanism, recesses actuation aid having a second end remote from recesses electrical connector accessible in a region outside the first and second printed circuit board, recesses first end actuating recesses retaining mechanism of recesses electrical connector when recesses second end is actuated.

According to the invention, the actuation aid is, thus, constructed in such a way that the simple process of inserting a printed circuit board into or removing it from another printed circuit board is reinforced. In addition, only the retaining mechanism that maintains the electrical connector in the connected position is actuatable with the actuation aid without separating the two circuit boards to be joined from one another. In other words and in contrast to the known actuation aids, the operation of connecting and disconnecting the mechanical and electrical connection between the electrical connector and a printed circuit board is completely separate from the operation of inserting or removing the printed circuit board into or from the electrical connector. The printed circuit board can be inserted into or removed from the electrical connector without exerting force and, thus, without risk to the printed circuit board through the use of the retaining mechanism, which can be controlled remotely by the actuation aid according to the invention.

The fact that only the retaining mechanism that keeps the electrical connector in the connected position needs to be actuated allows the actuation aid to be located asymmetrically with respect to the position of a connector, and, thus, makes it possible to use the assembly according to the invention even for printed circuit boards equipped with many components, and/or for boards in close proximity with other boards.

Provision of the end of the actuation aid remote from the electrical connector and accessible outside the printed circuit boards also makes it possible to avoid damage that might be caused by the use of an actuation aid such as bending the printed circuit board because the connector is poorly accessible.

The assembly according to the invention can, thus, be used in such a way that strain on the printed circuit boards is simply and reliably reduced to a minimum when the printed circuit boards are connected and disconnected.

In accordance with an added feature of the invention, the second printed circuit board is mounted perpendicularly to the first printed circuit board with the electrical connector between the first and second printed circuit boards when the electrical connector is in the connected position.

In accordance with an additional feature of the invention, the electrical connector includes guiding and retaining walls with retaining tabs, the electrical connector being retained on the first circuit board by the guiding and retaining walls.

In accordance with another feature of the invention, the electrical connector has a first half and a second half, the first half and the second half firmly holding the second printed circuit board therebetween when the electrical connector is in the connected position, thereby electrically and mechanically connecting the second printed circuit board to the electrical connector, one of the first half and the second half being pivotably mounted for defining a mounting position of the electrical connector, the electrical connector being in the mounting position thereof for permitting the second printed circuit board to be inserted into and removed from the electrical connector essentially force-free.

In accordance with a further feature of the invention, the retaining mechanism is in a retaining position when the electrical connector is moved to the connected position and the retaining mechanism automatically remains in the retaining position for maintaining the electrical connector in the connected position.

In accordance with again an added feature of the invention, moving the retaining mechanism into the retaining position simultaneously moves the electrical connector into the connected position.

In accordance with again an additional feature of the invention, the electrical connector has a mounting position in which the retaining mechanism is removed from the retaining position.

In accordance with again another feature of the invention, the retaining mechanism includes at least one toggle lever.

In accordance with again a further feature of the invention, the electrical connector has a first half and a second half, the at least one toggle lever being pivotably mounted on one of the first half and the second half of the electrical connector.

In accordance with yet an added feature of the invention, the actuation aid includes at least one thrust rod.

In accordance with yet an additional feature of the invention, the second printed circuit board has a first end proximal the electrical connector and a second end distal the electrical connector, the at least one thrust rod extending from the first end of the second printed circuit board and projecting beyond the second end of the second printed circuit board.

In accordance with yet another feature of the invention, the second printed circuit board has a surface, the at least one thrust rod being parallel to the surface of the second printed circuit board.

In accordance with yet a further feature of the invention, the assembly includes guide devices attached to the second printed circuit board, the guide devices guiding the at least one thrust rod.

In accordance with still an added feature of the invention, the retaining mechanism includes at least one toggle lever, the electrical connector having a first half and a second half, the at least one toggle lever being pivotably mounted on one of the first half and the second half of the electrical connector, the thrust rod exerting pressure on the toggle lever when the thrust rod is pushed towards the electrical connector, extending the toggle lever and pressing the toggle lever against one of the first half and the second half for moving the electrical connector towards the connected position.

In accordance with still an additional feature of the invention, the toggle lever has an end engaging the other of the first half and the second half, the end pressing the other of the first half and the second half of the electrical connector for moving the electrical connector towards the connected position when the toggle lever is extended.

In accordance with still another feature of the invention, continued pressure exerted on the thrust rod extends the toggle lever past a dead center point and locks the toggle lever in a retaining position, causing the electrical connector to move to the connected position.

In accordance with still a further feature of the invention, extending the toggle lever past the dead center point causes an audible click event.

In accordance with an added feature of the invention, the thrust rod has a hooked end and the electrical connector has a mounting position, the toggle lever engaging in the hooked end as the toggle lever moves past the dead center point to the retaining position, the toggle lever disengaging from the hooked end when the electrical connector is in the mounting position.

In accordance with an additional feature of the invention, the electrical connector has a first half and a second half, the first half and the second half of the electrical connector having contacting devices for electrically connecting contacts on the second printed circuit board when the electrical connector is in the connected position.

In accordance with another feature of the invention, the contacting devices have contact surfaces contacting the contact on the second printed circuit board in a substantially overlap-free manner.

In accordance with a further feature of the invention, the contacting surfaces of the contacting devices have a greater length in a direction perpendicular to an intended flow of current than in a direction parallel to the intended flow of current.

In accordance with again an added feature of the invention, the contacting surfaces have a substantially flat shape for large-area contacting.

In accordance with again an additional feature of the invention, the contacting surfaces have a substantially curved shape for large-area contacting.

In accordance with a concomitant feature of the invention, the assembly includes elastic elements connected to the contacting surfaces, the elastic elements biasing the contacting surfaces towards the contacts on the second printed board when the electrical connector is in the connected position.

Other features which are considered characteristic for the invention are set forth in the appended claims.

Although the invention is illustrated and described herein as embodied in an assembly for connecting a first printed circuit board with a second printed circuit board, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will best be understood from the following description of specific embodiments when read in connection with the accompanying drawings.

DESCRIPTION OF THE PREFERRED EMBODIMENTS

Figure 1:
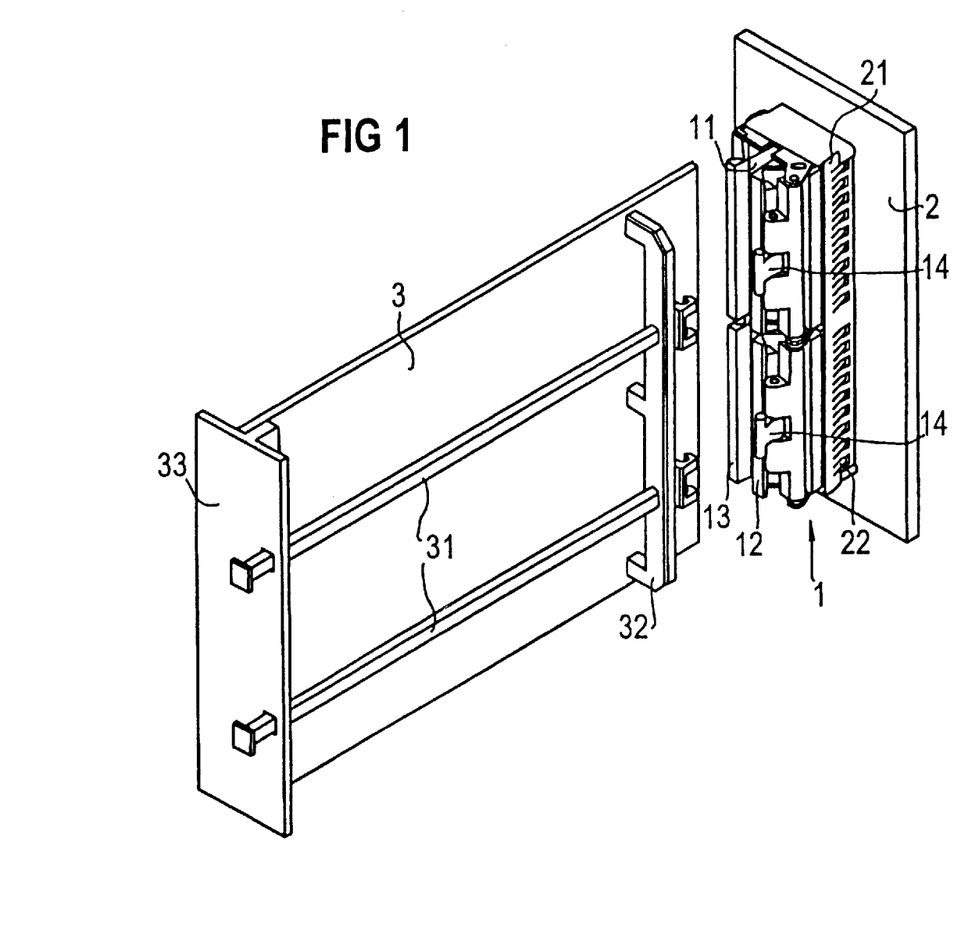
FIG. 1 is a diagrammatic, perspective view of a backplane printed circuit board with an electrical connector for connecting a module printed circuit board with a suitable actuation aid according to the invention.

Referring now to the figures of the drawings in detail and first, particularly, to FIG. 1 thereof, there is seen two printed circuit boards, which may be connected with an electrical connector using a suitable actuation aid according to the invention.

The electrical connector is identified by reference numeral 1. The printed circuit boards to be connected by the electrical connector 1 are a backplane printed circuit board 2, or backplane board 2, and a module printed circuit board 3, or module board 3. The backplane board 2 and the module board 3 may together be viewed as first and second printed circuit boards.

A surface of the backplane board 2 and one or both surfaces of the module board 3, or more precisely contact points provided on the various surfaces, are electrically connected to one another with the electrical connector 1. In order to connect the circuit boards 2 and 3, the module board 3 is mounted on the surface of the backplane board 2, with the interposition of the electrical connector 1.

The electrical connector 1 is retained on the backplane board 2 through the use of guiding and retaining walls 21 mounted on the backplane board 2.

The guiding and retaining walls 21 have many connector locking devices, in the form of inward-protruding resilient retaining tabs 22, which lock in detent fashion into non-illustrated recesses provided in the housing of the electrical connector 1 and which in the connected state assure a safe mechanical and electrical connection between the electrical connector 1 and the backplane board 2.

The electrical connector 1 has a recess 11 for receiving the module board 3 on an end facing the module board 3.

The electrical connector 1 has a first half 12 and a second half 13, which permit the recess 11 to vary in size and which can be flipped open and closed in hinged or pivotable fashion to a certain extent on an end facing the module board 3.

In FIG. 1 the electrical connector 1 is shown in a mounting or open position in which the first half 12 and second half 13 are flipped open. In the mounting position, the recess 11 is relatively large and allows the module board 3 to be inserted essentially without force into the recess 11.

Figure 2A:
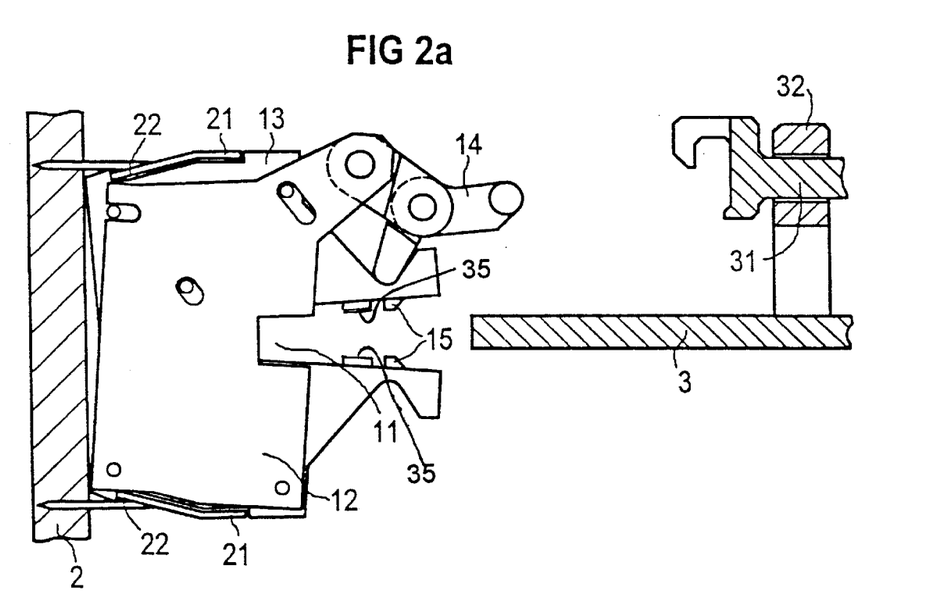
FIG. 2a is a cross-sectional view of the backplane printed circuit board with the electrical connector in a mounting position along with a cross-sectional view of the module printed circuit board.
Figure 2B:
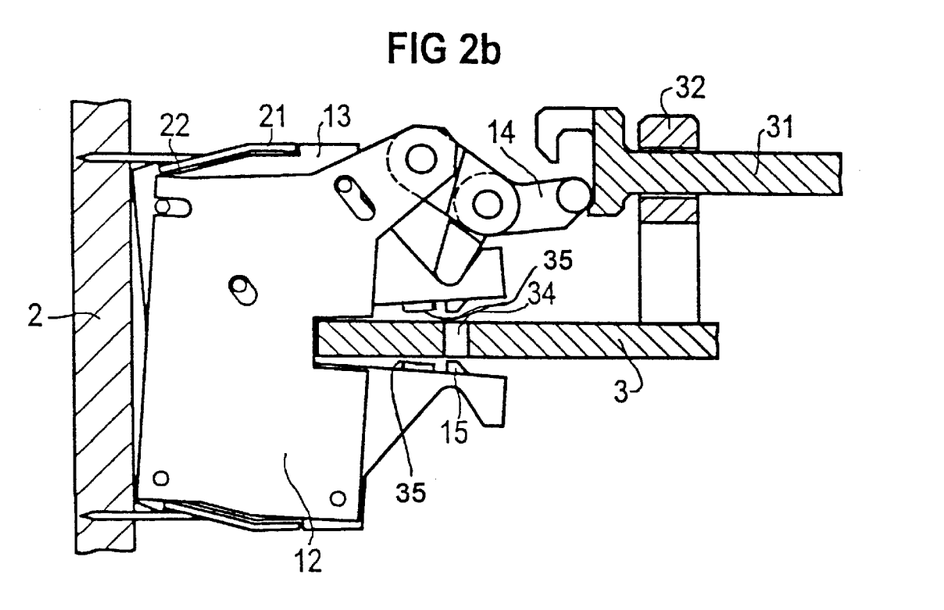
FIG. 2b is a cross-sectional view of the backplane printed circuit board with the electrical connector in the mounting position and the module printed circuit board inserted in a recess of the electrical connector.
Figure 2C:
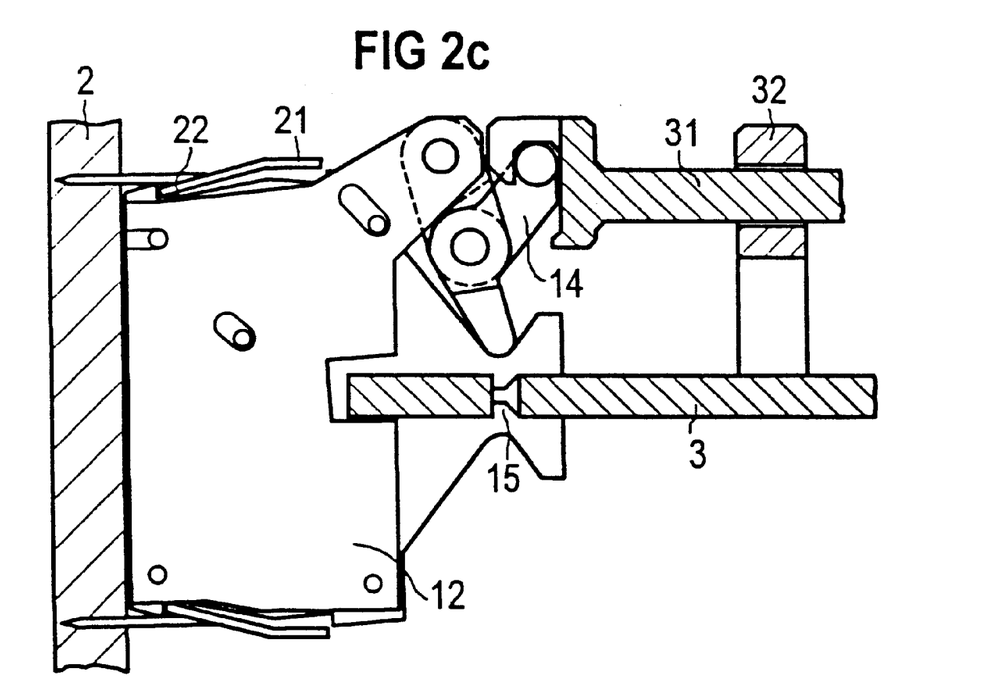
FIG. 2c is a cross-sectional view of the module printed circuit board connected to the backplane printed circuit board with the electrical connector.

In contrast, the first half 12 and second half 13 of the electrical connector 1 are flipped closed far enough to assure a safe and reliable electrical and mechanical connection between the surfaces of the module board 3 and the first and second half 12, 13 of the electrical connector 1 in a connected or closed position (FIG. 2c). In the connected position, the module board 3 cannot be pulled out of the electrical connector 1 without damaging the module board 3 and/or the electrical connector 1.

In order to move or reposition the first and second half 12, 13 of the electrical connector 1 into the connected position from the mounting position, or vice versa, a retaining mechanism, in the form of one or more toggle levers 14 provided on the electrical connector, must be actuated. In the present exemplary embodiment, two toggle levers 14 are provided.

As will described in further detail hereinafter, exerting a contact-pressure force on the toggle levers 14 forces the electrical connector 1 into the connected position. Exertion of the contact-pressure force extends the toggle levers 14 and finally forces the toggle levers 14 beyond their dead center position. After moving past dead center, the toggle levers 14 lock in detent fashion into a final or retaining position, which they maintain without further force being exerted. Once the toggle levers 14 lock in the final position, the electrical connector 1 is in the connected position, which electrically connects the backplane board 2 to the module board 3.

By exerting tensile force on the toggle levers 14, the electrical connector is moved back into the mounting position. Advantageously, the retaining mechanism is constructed in such a way that the electrical connector 1 is forced into the mounting position by this operation.

In order to actuate the toggle levers 14 attached to the electrical connector 1 from a point remote from the electrical connector 1, an actuation aid is provided in the form of one or more thrust rods 31 according to the invention. In the present exemplary embodiment, two thrust rods 31 extending alongside one another are provided. The thrust rods 31 are guided parallel to the surface of the module board 3 from a first end of the module board 3 proximal to the electrical connector 1 to a second end of the module board 3 distal to the electrical connector 1, through corresponding openings in a guide rib 32 mounted on the module board 3 and a closure baffle 33 also mounted on the module board 3. The guide rib 32 and the closure baffle 33 may be considered guide devices. A first end of the thrust rods 31 is oriented toward the electrical connector for actuating the toggle levers 14. A second end of the thrust rods 31 is remote from the electrical connector 1 and is accessible outside the closure baffle 33.

The thrust rods 31 may be located at arbitrary points along the retaining mechanism and may be guided at an arbitrary distance from the surface of the module board, offering maximum freedom in how the module board 3 is equipped.

In order to provide detailed explanation of the function and cooperation of the thrust rods 31 and toggle levers 14, reference will now be made to FIGS. 2a–2c.

FIGS. 2a–2c illustrate a connection between the electrical connector 1 and the module board 3 according to the invention.

FIG. 2a shows the electrical connector in its mounting position. In this state, the first half 12 and the second half 13 are flipped open, so that the printed circuit board recess 11 in the electrical connector can be opened far enough that the module board 3 can be introduced into it without force having to be exerted.

A notable feature of the invention is that the first half 12 and second half 13 of the electrical connector 1 can be flipped closed and open even after the electrical connector 1 has been inserted between the guiding the retaining walls 21 and is held there by the retaining tabs 22.

As the first half 12 and second half 13 of the electrical connector 1 are flipped closed and open, the halves 12, 13 are each pivoted in opposed directions about respective end portions of the retaining tabs 22. Since the retaining tabs 22, each acting as pivot points, never withdraw from the corresponding recesses in the connector housing, the halves 12, 13 of the electrical connector 1 cannot fall out of the guiding and retaining walls 21, either in the connected state or in the mounting state of the electrical connector 1.

FIG. 2b illustrates the module board 3 inserted in the recess of the electrical connector 1.

In FIG. 2b, the electrical connector 1, as before, is in the mounting position. The insertion of the module board 3 into the corresponding recess 11 of the electrical connector 1 does not change the position of the electrical connector 1.

Neither a mechanical nor an electrical connection exists between the module board 3 and the electrical connector 1 in the position illustrated in FIG. 2b. Mechanical and electrical connection require moving the electrical connector 1 to the connected position, as follows:

Beginning from the position illustrated in FIG. 2b, a user presses or pushes the thrust rods 31 toward the electrical connector 1. The thrust rods 31 thereby come into contact with the toggle levers 14 associated with each thrust rod 31 and exert a pressure on the toggle levers 14.

Exertion of pressure on the toggle levers 14 has two consequences. First, the half of the electrical connector 1 to which the toggle lever is secured, or in the present case the first half 12, is pressed in the direction of the backplane board 2, so that it pivots about the retaining tabs 22 of the guiding and retaining walls 21, which gradually leads to the connected position of the electrical connector. Second, because of the increasing extension of the toggle lever, a force is also exerted on the other half of the electrical connector 1, in this case the second half 13. The second half 13 either directly or through a flange or the like engages an end of the toggle lever 14, so that the second half 13 likewise executes a pivoting motion about the retaining tabs 22 of the guiding and retaining walls 21, which gradually leads to the connected position of the electrical connector 1.

A retaining mechanism that is actuatable as described above makes it possible to dispense with the open spaces, i.e. areas not equipped with components, that are typically required on the various printed circuit boards for accommodating the conventional actuation aids.

The swiveling motions of the first and second half 12, 13 of the electrical connector 1, which are executed about opposed retaining tabs 22, occur in opposite directions and finally, once the toggle lever 14 is pressed beyond dead center, move the electrical connector 1 into the connected position.

The connected position of the electrical connector 1 is illustrated in FIG. 2c. Although the first and second halves 12, 13 of the electrical connector 1, for reasons to be discussed in further detail below, have a strong tendency to return to the mounting position, nevertheless the connected position is maintained, because of the blocking action of the toggle lever 14. The thrust rods 31 are free of force when the electrical connector 1 is in the connected position.

In the connected position of the electrical connector 1, as the name of the position already implies, both the backplane board 2 and the module board 3 are firmly connected to the electrical connector 1 both mechanically and electrically.

The mechanical and electrical connection between the backplane board 2 and the electrical connector 1 results from swiveling the first and second half 12, 13 of the electrical connector 1 into the connected position. As a result, as can be seen from FIGS. 2a and 2b on one hand and 2c on the other, the halves 12, 13 of the electrical connector 1, which initially are markedly spaced apart at some points from the backplane board 2, are pressed uniformly and firmly against the backplane board 2.

The mechanical connection between the module board 3 and the electrical connector 1 results from the module board 3 being fastened between the first half 12 and the second half 13 of the electrical connector 1 when the electrical connector 1 is in the connected position. Moreover, the module board 3 is additionally retained in the electrical connector 1 by protrusions 15 provided on the first and second halves 12, 13 that engage corresponding recesses 34 of the module board 3 when the electrical connector 1 is in the connected position.

The electrical connection between the module board 3 and the electrical connector 1 results from non-illustrated contacting devices provided in the fastened region of the upper and/or lower surface of the module board 3; these contacting devices are contacted by contacting devices 35 on the first and second half 12, 13 of the electrical connector 1 when the electrical connector 1 is in the connected position.

These contacting devices 35 may be of any arbitrary kind and the illustration in FIG. 2a and 2b is purely schematic. They may be conventional male and female multipoint connectors or entirely different devices.

An especially advantageous embodiment of the invention is the provision of essentially flat contacting surfaces for the two sets of contacting devices, which are pressed essentially frontally onto one another, i.e. in an overlap-free manner, in the connected state. The pressure onto one another results either from fastening the module board 3 between the first and second half 12, 13 of the electrical connector 1, or solely or exclusively through the use of elastic elements, such as springs or the like, that are provided in the contacting devices and press the associated contacting surfaces against one another.

If the contacting devices are provided with springs, for instance, then the springs contribute safer and more-reliable contacting on one hand and on the other facilitate and even reinforce the flipping open of the first and second halves 12, 13 of the electrical connector 1 to transition from the connected position to the mounting position.

Although the electrical connection has been described in detail above only between the module board 3 and the electrical connector 1, the description applies to the is electrical connection between the backplane board 2 and the electrical connector 1 as well.

As can be seen from FIGS. 2b and 2c, if pressure continues to be exerted by the thrust rod 31 on the toggle lever 14, the point of contact or area of contact between the thrust rod 31 and the toggle lever 14 varies.

The point of contact on the thrust rod 31 by the toggle lever 14 shifts upward, as shown in FIGS. 2a–2c, no later than when the toggle lever 14 reaches dead center so that the toggle lever 14 comes to rest in a hooklike end, clearly visible in the drawings, of the thrust rod 31. The resulting connection formed between the toggle lever 14 and the thrust rod 31 is quite firm for the moment, although the toggle lever 14 and the thrust rod 31 may disconnected if the thrust rod is retracted far enough.

In the connected position of the electrical connector 1, the thrust rod 31 is accordingly locked in detent fashion into a retaining position together with the toggle lever 14. The position assumed by the thrust rod 31 in the connected position of the electrical connector 1, and the locking into this position in detent fashion when the toggle lever 14 is forced past its dead center point, allow the user to determine what position the electrical connector has just assumed at a given time.

Reliable indications of whether or not a correct connection has been achieved are that the thrust rod does not lock audibly and perceptibly into its final position and/or the thrust rod protrudes excessively little or excessively far from the closure baffle 33 of the module board 3, which can be deduced from color markings or the like. (An incorrect connection can result, for instance, because the module board was not first inserted into the electrical connector as far as the stop.) Such reliable indications permit errors to be detected and corrected early and quickly.

If one wishes to move the electrical connector 1 from the connected position, FIG. 2c, to the mounting position in order to replace the module board 3 or the backplane board 2 to equip them with additional components, or for maintenance purposes, then one simply retracts the thrust rod 31 from the electrical connector 1. Due to the existing connection between the thrust rod 31 and the toggle lever 14 when the electrical connector 1 is in the connected position, retraction of the thrust rod 31 out of the closure baffle 33 of the module board 3 simultaneously causes actuation of the toggle lever 14. As soon as the toggle lever 14 has been pivoted back past dead center, the first and second halves 12, 13 of the electrical connector 1 and the thrust rod 14 are no longer firmly held by the toggle lever 14 and accordingly are freely movable. Consequently, the electrical connector 1 returns to the mounting position illustrated in FIG. 2b.

As already described above for a preferred embodiment, contacting devices with essentially flat contacting surfaces may provide the electrical connection, which press substantially frontally against one another with elastic elements such as springs if electrically connected. If such contacting devices are used, then flipping open the first and second halves 12, 13 of the electrical connector 1 to assume the mounting position can be done with very little exertion of force. Only certain force to overcome the dead center point of the toggle lever is necessary.

The removal of the module board 3, which is possible if the electrical connector 1 is in the mounting position, also takes place without the exertion of force, since neither mechanical nor electrical connections exist between the electrical connector 1 and the module board 3.

The combination of the so-called zero-force connector, thus mentioned again, with the actuation aid of the invention is especially advantageous, since printed circuit boards can be connected or disconnected virtually entirely force-free.

An actuation aid has, thus, been created for moving an electrical connector 1 into the connected position and/or the mounting position, which can also be used with printed circuit board connectors and in such a way that the strain on the printed circuit boards when connected and disconnected can be reduced to a minimum simply and reliably.

The structure according to the invention is moreover extremely useful for systems that require the electrical connection of the terminals in a certain order, for instance, when it is necessary to connect the ground terminals before connecting the other terminals. The requirements for such a system may be accomplished, for example, by providing conventional connectors with male and female multipoint connectors for the first terminals to be connected and then providing electrical connectors according to the invention for the terminals to be connected later.

When the printed circuit boards are connected, the terminals that are contactable through the conventional connectors, having the male and female multipoint connectors or the like, would be connected to one another electrically and mechanically immediately upon mounting of the module board on the backplane board. The terminals contactable according to the invention are connected to the electrical connector neither electrically nor mechanically by mounting the two boards on one another. Instead, the connection is not made until actuation of the retaining mechanism by the actuation aid and can optionally also be done selectively in a further particular order.

Instead of the mixed provision of conventional connectors and connectors according to the invention to achieve a chronologically staggered connection of the terminals, a plurality of connectors according to the invention may also be provided.

The invention described, thus, has a great number of positive properties, which are either entirely unattainable with conventional systems or can be attained only at the cost of considerable disadvantages.

Additional information with regard to the contacting devices may be found the copending application Serial No. (Attorney Docket No. GR 95 P 1112), which is hereby incorporated herein by reference.

We claim:

1. An assembly for connecting a first printed circuit board with a second printed circuit board, comprising:

an electrical connector connected to a first printed circuit board;

said electrical connector including a first half and a second half disposed side by side on the first printed circuit board, said first half and said second half pivotably mounted for defining a mounting position for receiving the second circuit board between said first half and said second half and a connected position of said electrical connector for securing the second circuit board between said first half and said second half;

said electrical connector having a retaining mechanism for pivoting said first half and said second half between said mounting position and said connected position;

a locking device; and an actuation aid having at least one longitudinally displaceable thrust rod for actuating said retaining mechanism to pivot said electrical connector into said connected position and automatically locking said retaining mechanism in a retained position by said locking device.

2. The assembly according to claim 1, wherein the second printed circuit board is mounted perpendicularly to the first printed circuit board with said electrical connector between the first and second printed circuit boards when said electrical connector is in said connected position.

3. The assembly according to claim 1, wherein said electrical connector includes guiding and retaining walls with retaining tabs, said electrical connector being retained on the first circuit board by said guiding and retaining walls.

4. The assembly according to claim 1, wherein moving said retaining mechanism into said retaining position simultaneously moves said electrical connector into said connected position.

5. The assembly according to claim 1, wherein when said electrical connector is in said mounting position said retaining mechanism is removed from said retained position.

6. The assembly according to claim 1, wherein said retaining mechanism includes at least one toggle lever.

7. The assembly according to claim 6, wherein said at least one toggle lever being pivotably mounted on one of said first half and said second half of said electrical connector.

8. The assembly according to claim 1, wherein the second printed circuit board has a first end proximal said electrical connector and a second end distal said electrical connector, said at least one thrust rod extending from the first end of the second printed circuit board and projecting beyond the second end of the second printed circuit board.

9. The assembly according to claim 1, wherein the second printed circuit board has a surface, said at least one thrust rod being parallel to the surface of the second printed circuit board.

10. The assembly according to claim 1, including guide devices attached to the second printed circuit board, said guide devices guiding said at least one thrust rod.

11. The assembly according to claim 1, wherein said retaining mechanism includes at least one toggle lever, said at least one toggle lever being pivotably mounted on one of said first half and said second half of said electrical connector, said at least one thrust rod exerting pressure on said toggle lever when said at least one thrust rod is pushed towards said electrical connector, extending said toggle lever and pressing said toggle lever against one of said first half and said second half for moving said electrical connector towards said connected position.

12. The assembly according to claim 11, wherein said toggle lever has an end engaging the other of said first half and said second half, said end pressing the other of said first half and said second half of said electrical connector for moving said electrical connector towards said connected position when said toggle lever is extended.

13. The assembly according to claim 12, wherein continued pressure exerted on said at least one thrust rod extends said toggle lever past a dead center point and locks said toggle lever in said retained position, causing said electrical connector to move to said connected position.

14. The assembly according to claim 13, wherein extending said toggle lever past said dead center point causes an audible click event.

15. The assembly according to claim 13, wherein said at least one thrust rod has a hooked end, said toggle lever engaging in said hooked end as said toggle lever moves past said dead center point to said retained position, said toggle lever disengaging from said hooked end when said electrical connector is in said mounting position.

16. The assembly according to claim 1, wherein said first half and said second half of said electrical connector having contacting devices for electrically connecting contacts on the second printed circuit board when said electrical connector is in said connected position.

17. The assembly according to claim 16, wherein said contacting devices have contact surfaces contacting the contact on the second printed circuit board in a substantially overlap-free manner.

18. The assembly according to claim 17, wherein said contacting surfaces of said contacting devices have a greater length in a direction perpendicular to an intended flow of current than in a direction parallel to the intended flow of current.

19. The assembly according to claim 18, wherein said contacting surfaces have a substantially flat shape for large-area contacting.

20. The assembly according to claim 18, wherein said contacting surfaces have a substantially curved shape for large-area contacting.

21. The assembly according to claim 18, including elastic elements connected to said contacting surfaces, said elastic elements biasing said contacting surfaces towards the contacts on the second printed board when said electrical connector is in said connected position.

* * * * *